United States Patent [19]
Palmour

[11] Patent Number: 5,612,260
[45] Date of Patent: Mar. 18, 1997

[54] METHOD OF OBTAINING HIGH QUALITY SILICON DIOXIDE PASSIVATION ON SILICON CARBIDE AND RESULTING PASSIVATED STRUCTURES

[75] Inventor: John W. Palmour, Cary, N.C.

[73] Assignee: Cree Research, Inc., Durham, N.C.

[21] Appl. No.: 353,456

[22] Filed: Dec. 9, 1994

Related U.S. Application Data

[63] Continuation of Ser. No. 893,642, Jun. 5, 1992, Pat. No. 5,459,107.

[51] Int. Cl.$^6$ .................................................. H01L 21/02
[52] U.S. Cl. ........................ 437/238; 437/100; 437/234; 437/240; 437/243; 148/DIG. 148
[58] Field of Search ............................... 437/100, 238, 437/239, 240, 243, 234; 148/DIG. 148

[56] References Cited

U.S. PATENT DOCUMENTS

| | | | |
|---|---|---|---|
| 3,911,168 | 10/1975 | Schinella et al. | 427/93 |
| 4,757,028 | 7/1988 | Kondoh et al. | 437/100 |
| 4,865,685 | 9/1989 | Palmour | 156/643 |
| 4,866,005 | 9/1989 | Davis et al. | 437/100 |
| 4,912,063 | 3/1990 | Davis et al. | 437/100 |
| 4,912,064 | 3/1990 | Kong et al. | 437/100 |
| 4,994,413 | 2/1991 | Eshita | 437/244 |
| 5,087,576 | 2/1992 | Edmond et al. | 437/100 |
| 5,135,885 | 8/1992 | Furukawa et al. | 437/100 |
| 5,216,264 | 6/1993 | Fujii et al. | 257/289 |
| 5,272,107 | 12/1993 | Suzuki et al. | 437/239 |

FOREIGN PATENT DOCUMENTS

| | | |
|---|---|---|
| 0363944 | 4/1990 | European Pat. Off. . |
| 3434727 | 4/1985 | Germany . |
| 4009837 | 10/1990 | Germany . |
| 3-9534 | 1/1991 | Japan . |

OTHER PUBLICATIONS

*6H–Silicon Carbide Transistors for High Temperature Operation*, J. W. Palmour et al., Proceedings, First International High Temperature Electronics Conference, Jun. 16–20, 1991, pp. 511–518.

*Dopant Redistribution During Thermal Oxidation of Monocrystalline Beta–SiC Thin Films*, J. W. Palmour et al., Journal of Electrochemical Society, vol. 136, No. 2, Feb. 1989, pp. 502–507.

*Wet and Dry Oxidation of Single Crystal β–SiC: Kinetics and Interface Characteristics*, J. W. Palmour et al., Mat. Res. Soc. Symp. Proc., vol. 54, pp. 553–559.

*SiC Electronics For High Temperature Control Systems*, D. M. Brown et al., (4pages), presented at GOMAC-91, Nov. 4-7, 1991, Orlando, FL.

Primary Examiner—Trung Dang
Attorney, Agent, or Firm—Bell, Seltzer, Park & Gibson, P.A.

[57] ABSTRACT

A method of obtaining high quality passivation layers on silicon carbide surfaces by oxidizing a sacrificial layer of a silicon-containing material on a silicon carbide portion of a device structure to substantially consume the sacrificial layer to produce an oxide passivation layer on the silicon carbide portion that is substantially free of dopants that would otherwise degrade the electrical integrity of the oxide layer.

10 Claims, 5 Drawing Sheets

METHOD OF OBTAINING HIGH QUALITY SILICON DIOXIDE PASSIVATION ON SILICON CARBIDE AND RESULTING PASSIVATED STRUCTURES

This invention was made with Government support and the Government has certain rights in this invention.

This is a continuation of Ser. No. 07/893,642; filed Jun. 5, 1991, now U.S. Pat. No. 5,459,107.

FIELD OF THE INVENTION

The present invention relates to a method of passivating microelectronic structures and in particular relates to passivation of silicon carbide structures using silicon dioxide.

BACKGROUND OF THE INVENTION

Silicon carbide (SIC) has a number of theoretical and practical advantages that make its use desirable in microelectronic devices. These advantages are fairly well known and include a wide band gap, a high breakdown field, high thermal conductivity, high electron drift velocity, excellent thermal stability, and excellent radiation resistance or "hardness." These advantages have been recognized and described thoroughly in the patent and nonpatent literature.

One of the chemical advantages of silicon carbide is its ability to form a stable and well understood oxide, namely silicon dioxide ($SiO_2$), that can be used to passivate silicon carbide structure and devices. As known to those familiar with electronic devices, an appropriate thermally-grown oxide passivation layer provides an associated advantageous oxide-semiconductor interface that largely eliminates the presence of dangling bonds (sometimes referred to as dangling valences) on the semiconductor surface, and thus largely eliminates the associated problems such as interface charges and traps.

There are, however, some problems that arise from silicon dioxide passivation on silicon carbide because of certain properties of silicon carbide. In particular, a common p-type dopant for silicon carbide is aluminum. Although aluminum gives the highest p-type conductivity in silicon carbide, it recently has been discovered that the presence of aluminum incorporated into the thermally grown oxide passivation layers on p-type silicon carbide tend to cause high fixed oxide charge and high trap density at the silicon dioxide-silicon carbide interface. If the aluminum concentration is sufficiently high (for example when an oxide is grown on $p^+$ silicon carbide) the resulting oxide can have very high leakage currents, rendering it disadvantageous or even useless for passivation or electrical isolation. This problem does not occur when passivating silicon with silicon dioxide because aluminum is not a common dopant for silicon.

As a result of these characteristics, when thermally grown oxides have been used to passivate structures such as mesa $p^+n^-$ junctions in silicon carbide, the resulting devices tend to demonstrate excessive leakage currents in reverse bias at relatively high voltages (i.e., greater than 50 volts). This leakage current is apparently caused by the poor quality of the passivation on the $p^+$ side of the junction, causing what effectively amounts to a short circuit around the junction. In some p-channel MOSFETs (metal-oxide-semiconductor field effect transistor), the gate contact has been observed to short entirely through the oxide where it overlaps the $p^+$ source and drain wells.

Additionally, in n-channel MOSFETs, where the electrical integrity of the oxide layers over the aluminum doped p-type channel region are extremely important, the high interface trap density and fixed oxide charge tend to cause the transistors to have high threshold voltages, low transconductances, low channel mobilities at room temperature, and all of which properties tend to change dramatically with temperature. As these MOSFETs are heated, their behavior improves because the increasing density of thermally generated carriers tend to fill the interface traps.

Another problem that arises from the difference between silicon carbide and silicon is that carbon-oxygen compounds are generated by the oxidation of silicon carbide during passivation that are not generated during passivation of silicon. Although not known for certain, these carbon-oxygen species may have their own degrading effect on the electrical integrity of silicon dioxide layers grown on silicon carbide, possibly contributing to fixed oxide charge and premature electric breakdown or wear out.

Finally, earlier work has demonstrated that n-type dopants such as nitrogen tend to pile up severely during thermal oxidation of silicon carbide, resulting in an interfacial concentration more than ten times higher than the bulk of the material. Such dopant pile up could additionally have a profound effect on the electrical characteristics of devices such as MOSFETs.

Therefore, there exists the need to develop a method for passivating silicon carbide device structures advantageously with silicon dioxide while avoiding the aforementioned problems.

OBJECT AND SUMMARY OF THE INVENTION

The object of the present invention is to provide a method, and resulting structures, of obtaining high quality passivation layers on silicon carbide surfaces, and their associated high quality oxide-semiconductor interfaces in which the oxide passivation layers are substantially free of dopants and carbon-oxygen by-product species that would otherwise degrade the electrical integrity of the oxide layer.

The invention meets this object by oxidizing a sacrificial layer of a silicon-containing material on a silicon carbide portion of a device structure to substantially consume the sacrificial layer to produce an oxide passivation layer on the silicon carbide portion that is substantially free of dopants and of carbon-oxygen by-product species that would otherwise degrade the electrical integrity of the oxide layer.

In another embodiment, the invention comprises oxidizing a device structure formed of a layer of silicon dioxide of a desired thickness on a silicon carbide portion of the device structure to slightly extend the interface between the silicon dioxide and the silicon carbide into the silicon carbide portion. Further to this embodiment, the method comprises depositing a layer of silicon dioxide of a desired thickness on the silicon carbide portion of the device structure without oxidizing the silicon carbide portion prior to the step of oxidizing the device structure.

In another embodiment, the invention comprises a silicon carbide based device precursor structure comprising a silicon carbide portion and a sacrificial layer of a silicon-containing material on the silicon carbide portion in which the sacrificial layer is selected from the group consisting of polycrystalline silicon (Si), silicon nitride ($Si_3N_4$), or undoped silicon carbide.

In another embodiment, the invention comprises a silicon carbide-based device structure having passivation areas that are substantially free of the impurities normally associated with oxides grown on silicon carbide in which the structure comprises a silicon carbide portion and a thermally grown oxidation layer on the silicon carbide portion in which the oxidation layer is substantially free of aluminum and of carbon-oxygen by-products typically associated with thermal oxidation of silicon carbide.

The foregoing and other objects, advantages and features of the invention, and the manner in which the same are accomplished, will become more readily apparent upon consideration of the following detailed description of the invention taken in conjunction with the accompanying drawings which illustrate preferred and exemplary embodiments, and wherein:

DETAILED DESCRIPTION

The present invention is a method of obtaining high quality passivation layers on silicon carbide surfaces. In one embodiment, the method comprises oxidizing a sacrificial layer of a silicon-containing material on a silicon carbide portion of a device structure to substantially consume the sacrificial layer to produce an oxide passivation layer on the silicon carbide portion that is substantially free of dopants and carbon-oxygen byproduct species that would otherwise degrade the electrical integrity of the oxide layer. In the preferred embodiment, the method further comprises the step of forming the sacrificial layer of a silicon containing material on a silicon carbide portion of a device structure prior to the step of thermally oxidizing the sacrificial layer. In preferred embodiments, the step of forming the sacrificial layer comprises forming the sacrificial layer from the group consisting of polycrystalline silicon, silicon nitride or undoped silicon carbide. As used herein, an undoped layer of silicon carbide would preferably have a carrier concentration of 5E16 ($5 \times 10^{-16}$ cm$^{-3}$) or less.

Silicon is the most preferred material for the sacrificial layer because it is free of carbon to begin with, and hence substantially eliminates the presence of carbon-oxygen byproducts when oxidized. Furthermore, silicon oxidizes much faster than silicon carbide, so that at an appropriate oxidation rate for silicon, the oxidation effectively stops when the silicon has been consumed, but before any appreciable amount of silicon carbide will be consumed. As a result, a high quality SiO$_2$-SiC interface can be controllably formed.

Further to the preferred embodiment, the step of forming a sacrificial layer comprises forming a sacrificial layer of a predetermined desired thickness and wherein the step of thermally oxidizing the sacrificial layer comprises thermally oxidizing the sacrificial layer for a time sufficient to substantially consume the sacrificial layer at the rate of thermal oxidation being used.

Additionally, in preferred embodiments, the silicon carbide portion of the device structure comprises a silicon carbide portion having a polytype selected from the group consisting of the 6H, 3C, 4H, 2H and 15R polytypes of silicon carbide.

In the preferred embodiments, the step of oxidizing the sacrificial layer comprises thermally oxidizing the sacrificial layer, and most preferably while avoiding oxidation of the underlying silicon carbide portion. In this regard, the thermal oxidation should desirably produce an oxide layer having a thickness sufficient to have substantially consumed the sacrificial layer based on the thickness of the sacrificial layer and the oxide consumption factor of the silicon containing material in the sacrificial layer. As used herein, the consumption factor for the silicon-containing material's oxidation represents the ratio of the density of silicon atoms in silicon dioxide to the density of silicon atoms in the silicon-containing material. Thus, the step of thermally oxidizing the sacrificial layer comprises oxidizing the layer on the basis of the layer's thickness and the oxide consumption factor for the silicon-containing material.

As discussed in the background, the method of the invention is most useful in avoiding contamination of aluminum into the oxide. Accordingly, the step of forming a sacrificial layer preferably comprises forming the sacrificial layer on a p-type portion of silicon carbide, and most preferably on an aluminum doped p-type portion of silicon carbide.

As a further advantage, the use of the sacrificial layer of the present invention eliminates the potential for dopant redistribution in the underlying SiC during thermal oxidation, a problem that can arise when the SiC layer is oxidized directly.

In an alternative embodiment, the method can comprise the step of depositing a boron-doped silicon carbide layer between the silicon carbide portion and the sacrificial silicon layer when silicon is used as the sacrificial layer. The boron-doped silicon carbide layer can be selected from the group consisting of semi-insulating boron-doped silicon carbide layers and p-type boron-doped silicon carbide layers.

In another alternative embodiment, the sacrificial layer can be formed entirely of a boron-doped silicon carbide epitaxial layer. As known to those familiar with silicon carbide and silicon dioxide, boron (B) is a p-type dopant for silicon carbide, but one which has little or no negative effect on the electronic properties of silicon dioxide. Additionally, because such a layer has p-type characteristics, it need not be entirely consumed during oxidation when used over another p-type SiC layer or substrate.

In a preferred embodiment, when a silicon layer is used as the sacrificial layer, the method comprises oxidizing the silicon layer to produce an oxide passivation layer having an aluminum dopant concentration of 3E17 ($3 \times 10^{-17}$ cm$^{-3}$) or less.

In an alternative embodiment, the method of the invention can comprise oxidizing a device structure formed of a layer of silicon dioxide of a desired thickness on a silicon carbide portion of the device structure to slightly extend the interface between the silicon dioxide and the silicon carbide into the silicon carbide portion. As in the previous embodiment, the oxidizing step preferably comprises thermal oxidation of the device structure. Most preferably, the method of this embodiment further comprises the step of depositing the layer of silicon dioxide of a desired thickness on the silicon carbide portion of the device structure without oxidizing the silicon carbide portion prior to the step of oxidizing the overall device structure. In this regard, the preferred method of depositing a layer of silicon dioxide of a desired thickness on the silicon carbide portion comprises depositing the layer by chemical vapor deposition. As in the previous embodiment, the silicon carbide portion preferably has a polytype selected from the group consisting of the 6H, 3C, 4H, 2H and 15R polytypes of silicon carbide. Similarly, the invention has been found to be most useful when the step of depositing the layer of silicon dioxide comprises depositing the layer on an aluminum doped, p-type portion of silicon carbide.

In another embodiment, the invention comprises a silicon carbide-based device precursor structure comprising a silicon carbide portion and a sacrificial layer of a silicon-containing material on the silicon carbide portion, with the sacrificial layer being selected from the group consisting of polycrystalline silicon, polycrystalline silicon nitride or undoped silicon carbide (polycrystalline or epitaxial). The carrier concentrations preferred for undoped silicon carbide in the previous embodiments would similarly be preferred for this embodiment. In particular, in a preferred embodiment of the device precursor structure of the invention, the sacrificial layer comprises undoped silicon carbide having a carrier concentration of 5E16 ($5 \times 10^{-16}$ cm$^{-3}$) or less.

In another embodiment, the invention comprises a silicon carbide base device structure having passivation areas that are substantially free of the impurities normally associated with oxides grown on silicon carbide. The structure comprises a silicon carbide portion, and a thermally grown oxidation layer upon the silicon carbide portion, the oxidation layer being substantially free of aluminum and of carbon-oxygen by-products typically associated with thermal oxidation of silicon carbide. In the most preferred device structure, the oxidation layer has an aluminum dopant concentration of 3E17 ($3 \times 10^{-17}$ cm$^{-3}$) or less. As known to those familiar with silicon carbide and with microelectronic device structures, the silicon carbide portion of the device structure can be selected from the group consisting of substrates, epitaxial layers, mesa sidewalls, implanted or diffused wells, and any combination of these structural elements.

Figure 1A:
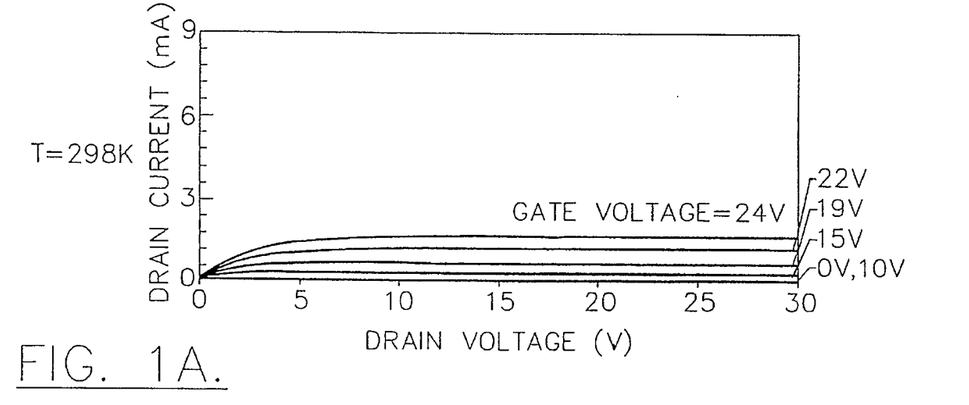
FIGS. 1(a)–1(c) are plots of drain current-voltage characteristics of a 6H-SiC inversion-mode MOSFET at (a) 298K, (b) 473K, and (c) 673K.
Figure 1B:
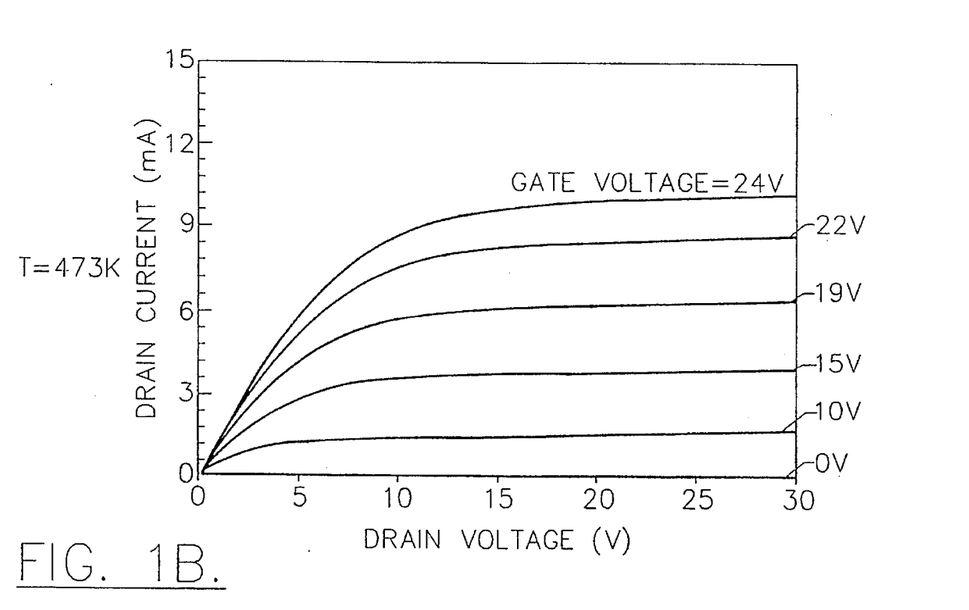
Figure 1C:
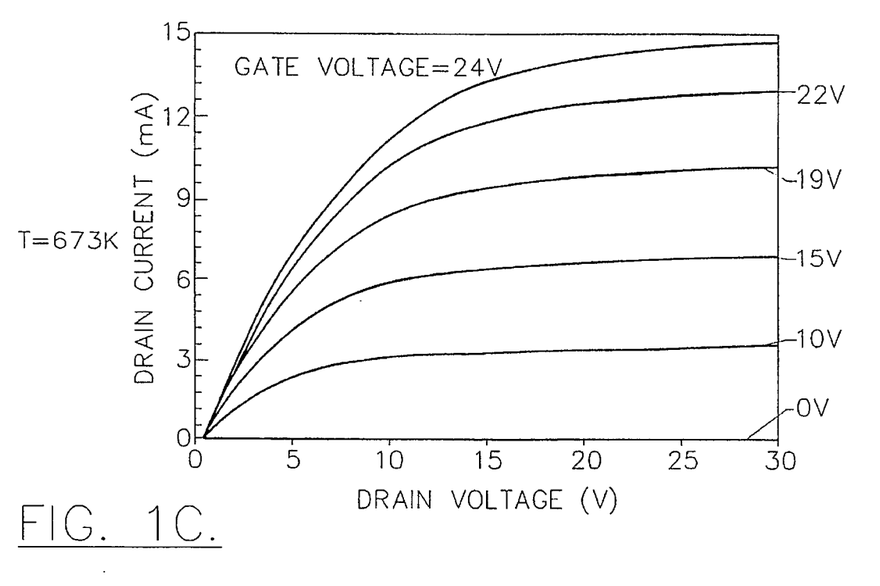
Figure 2A:
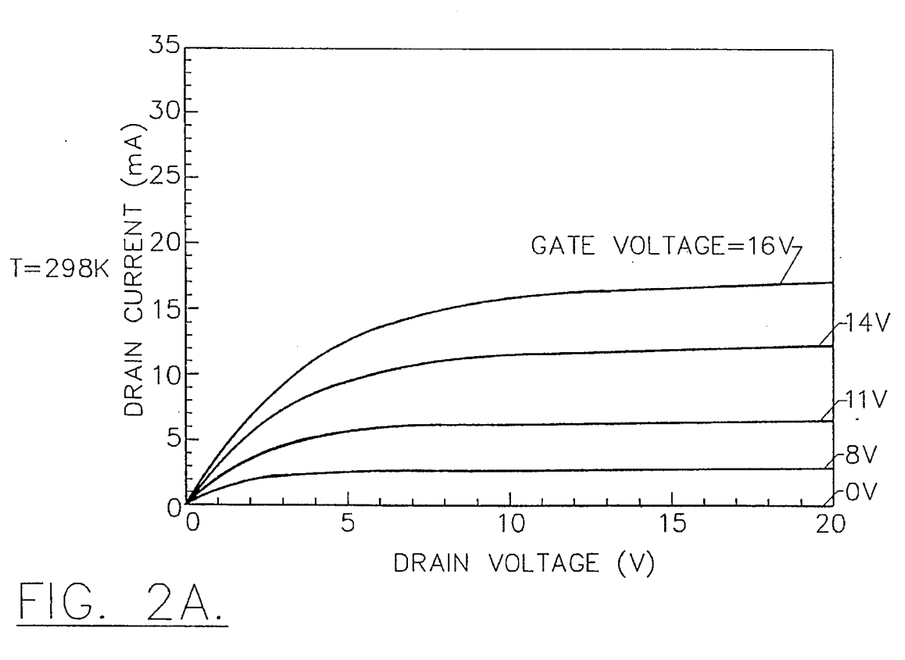
FIGS. 2(a)–2(c) are plots of drain current-voltage characteristics for a 6H-SiC n-channel inversion-mode MOSFET showing the effects of reducing aluminum in the oxide and measured at (a) 298K, (b) 423K, and (c) 573K.

FIGS. 1 and 2, although not representing identical devices, demonstrate some of the advantages of the present invention. FIG. 1 is a set of three plots of drain current versus drain voltage at selected gate voltages for a 6H-SiC inversion-mode MOSFET at temperatures of 298K, 473K, and 673K. The techniques of the present invention were not used in producing the MOSFET characterized by FIG. 1, and FIG. 1 is thus included for comparative purposes.

By way of such comparison, FIG. 2 represents the same information as FIG. 1 taken at 298K, 423K, and 573K in which an attempt was made to eliminate aluminum entirely from the oxide. This was first attempted on some planar MOSFETs fabricated on the Si-face of silicon carbide and utilizing ion implanted n$^+$ source and drain wells. By way of further comparison, the device of FIG. 1 was produced using dry oxide techniques, while that of FIG. 2 was produced by a wet oxide process. Furthermore, the p-channel of the FIG. 2 device contained less aluminum than the p-channel of the FIG. 1 device.

Appropriate techniques for producing bulk silicon carbide, epitaxial layers of silicon carbide, ion implantation of silicon carbide, and dry etching of silicon carbide are set forth in numerous prior patents that are either assigned or exclusively licensed to the assignee of the present invention and specifically U.S. Pat. Nos. 4,912,063; 4,912,064; 4,865,685; 4,866,005; and 5,087,576. These patents are incorporated entirely herein by reference.

The major difference between the MOSFETs formed in the attempt to eliminate aluminum from the oxide and previous MOSFETs was the incorporation of a very thin layer of undoped 6H-SiC grown on top of the p-channel layer. The p-type layer was first grown and measured to have p=$4.3 \times 10^{15}$ cm$^{-3}$. Next, an epitaxial layer of undoped silicon carbide only 37 nanometers (nm) thick (n=$2-8 \times 10^{15}$ cm$^{-3}$) was grown on top. As previously described herein, the purpose of including this layer is to consume it during oxidation so that the SiO$_2$/SiC interface stops at a point very close to the p-type material or only one or two monolayers into it.

After fabricating the devices and implanting the wells, the device wafers were oxidized in wet oxygen at 1200° C. for 49 minutes, yielding an oxide thickness of 62 nanometers. Assuming an oxide consumption factor of 0.47, and the loss of about 6 nanometers in a previous reactive ion etching (RIE) step, this thickness would have brought the SiO$_2$/SiC interface to within about 2 nm of the p-type material. Although it could not be specifically confirmed whether such dimensions were really the case or whether the interface had aluminum present, it was certain that there was much less aluminum present in the oxide than in previous MOSFETs.

FIGS. 1 and 2 show the improvements provided by the invention in such devices. For the device characterized in FIG. 1, the maximum transconductance was 0.25 millisiemens per millimeter (mS/mm) at a gate voltage of +24 volts (V). The on-current at a gate voltage of +16 V was 0.5 milliamps (mA). In the invention, and as indicated in FIG. 2, the room temperature drain current at a gate voltage of 16 volts was 18.6 mA and the transconductance at that gate voltage was 2.8 mS/mm. The threshold voltage was about 1.9 volts, which is much lower than the 9 to 12 volts obtained for the device in FIG. 1. The channel mobility was measured to be about 46 cm$^2$/V-sec, and the subthreshold leakage current (gate voltage equals 0 volts) was 560 nanoamps (nA).

Figure 2B:
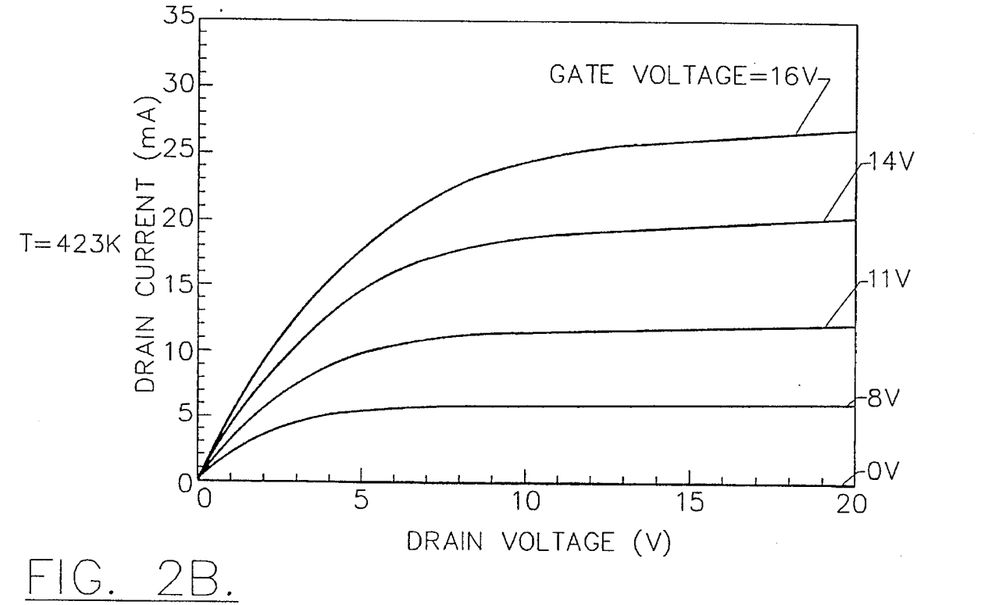
Figure 2C:
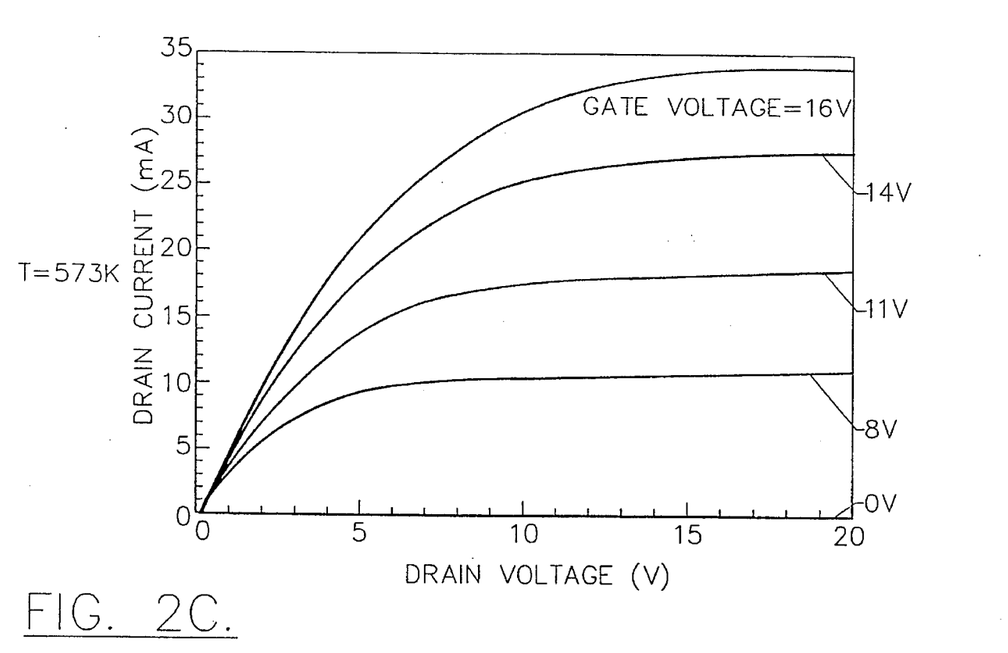

FIGS. 2(b) and 2(c) show the comparative operation of the device at higher temperatures. When the temperature was raised to 150° C., as shown in FIG. 2(b), both the current and transconductance at a gate voltage of 16 volts increased to 29 mA and 3.6 mS/mm, and the threshold voltage decreased to about −0.2 volts. This trend continued up to 300° C., as shown in FIG. 2(c). At this temperature, the current and transconductance at the gate voltage of 16 volts were 35 mA and 3.9 mS/mm, respectively. Although the threshold voltage of the device fell to −0.8 volts, the drain current at a gate voltage of 0 volts was only 47 microamps (μA). The channel mobility at 300° C. decreased to about 43.5 cm$^2$/V-sec.

FIGS. 3 and 4 further illustrate the use of the invention and the resulting product.

Figure 3A:
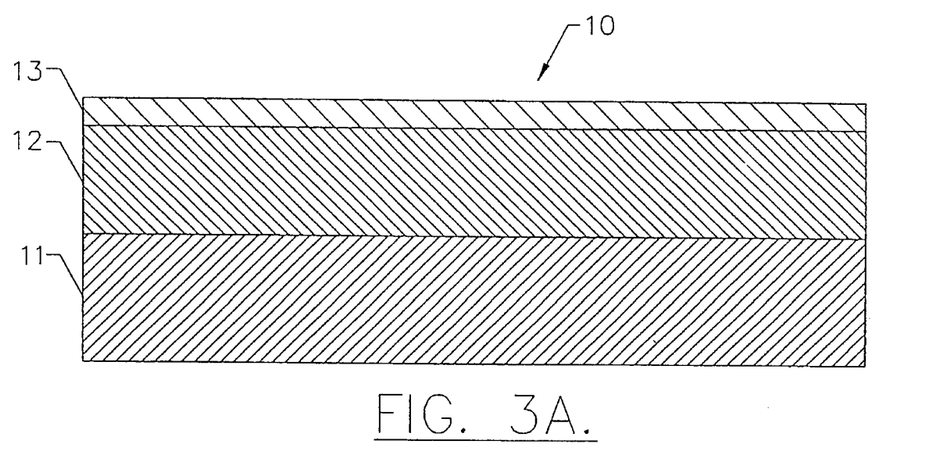
FIGS. 3(a) and 3(b) are the initial and final device structures for an n-channel planar MOSFET structure incorporating the present invention.

FIG. 3(a) shows a device precursor broadly designated at 10 formed of an n-type 6H-SiC substrate 11 and a p-type 6H epitaxial layer 12. In accordance with the invention, and in preparation for passivation, a sacrificially undoped epitaxial layer ("epilayer") 13 is added upon the p-type epitaxial layer 12.

Figure 3B:
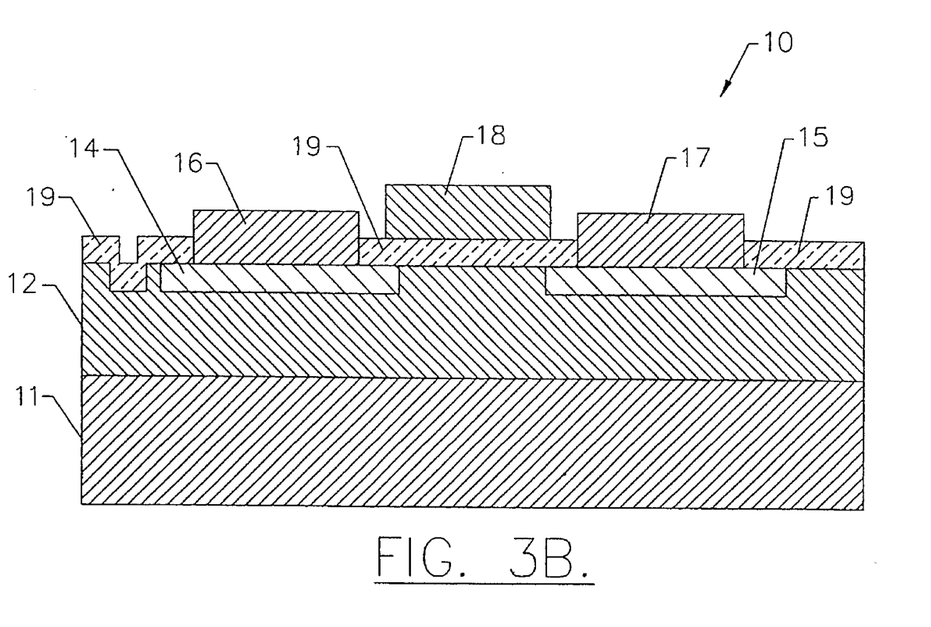

After oxidation and further processing the finished device, again designated at 10 for the sake of consistency, is illustrated in FIG. 3(b). FIG. 3(b) again illustrates the n-type substrate 11 and p-type epitaxial layer 12, but also shows respective n+ implanted wells 14 and 15, a metallic source contact 16, a metallic drain contact 17, and a metallic gate contact 18. In preferred embodiments, the source and drain contacts 16,17 are formed of nickel and the gate contact 18 of molybdenum. The oxide layer 19 resulting from the oxidation of the undoped epitaxial layer 13, is also illustrated in FIG. 3(a). By incorporating the method of the present invention, the oxide layer 19 is formed from the undoped layer 13 rather than from the p-type layer 12 to thus minimize the dopant concentration in the oxide and any associated problems.

Figure 4A:
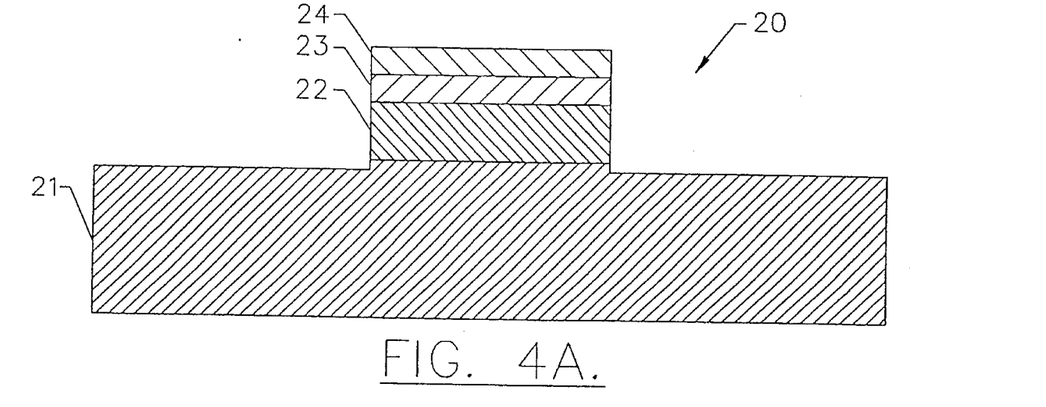
FIGS. 4(a), (b), and (c) are progressive cross-sectional views of the processing methodology for a hi-lo IMPATT diode incorporating the present invention.

FIG. 4 shows the progressive formation of a mesa type IMPATT (impact avalanche transit time) device broadly designated at 20 and incorporating the method of the present invention. FIG. 4(a) illustrates an n-type 6H SiC substrate 21, an n-type epilayer 22, a second n-type epilayer 23, and a p-type epilayer 24. In a typical embodiment, the first n-type epitaxial layer 22 has a carrier concentration of between about 2 and 3E16, the second n-type epitaxial layer 23 has a carrier concentration of about 7E17, and the p-type epitaxial layer has a carrier concentration of 5E18 or higher.

Figure 4B:
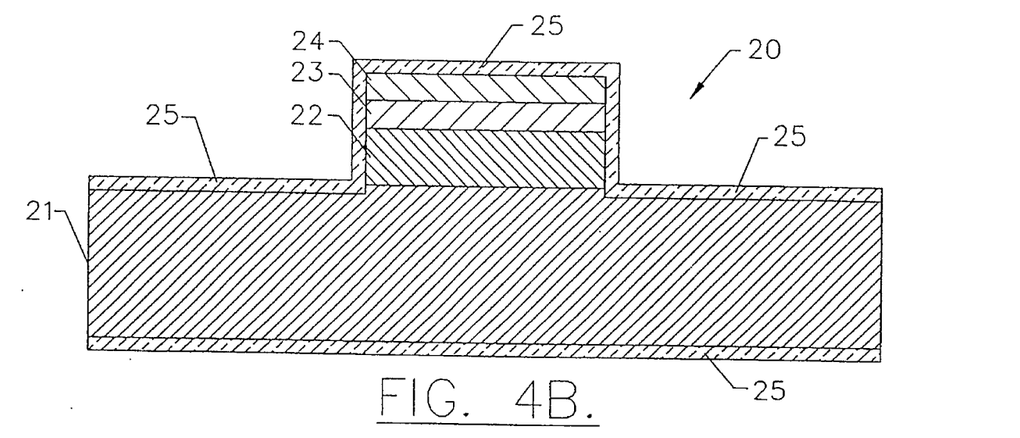

FIG. 4(b) illustrates the same structure but with the addition of a thin layer of polysilicon 25 to both the mesa and rear portions of the device. The thin polysilicon layer 25 is, of course, the sacrificial layer referred to herein. As set forth earlier herein, in certain embodiments a thin boron-doped silicon carbide layer can be added between the polysilicon layer 25 and the surface or edges of the respective SiC layers 21, 22, 23 and 24. The boron-doped layer should be thick enough to keep aluminum from the interface while otherwise remaining as thin as possible. An appropriate thickness presently appears to be between about 1 and 50 nm.

Figure 4C:
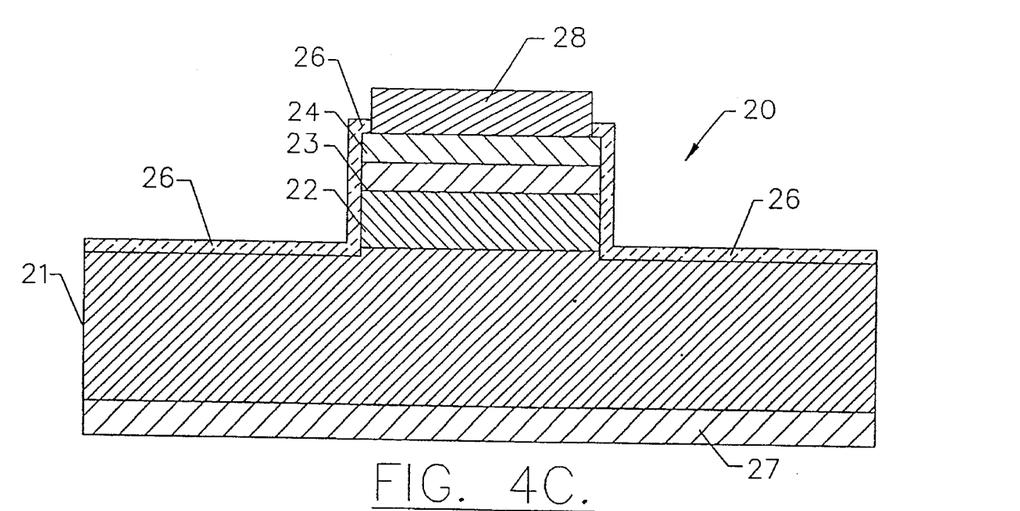

FIG. 4(c) illustrates a completed device after incorporation of the invention. The difference from FIG. 4(b) is the consumption of the polysilicon layer on the mesa portion of the device to form the passivation oxide layer 26. Again, by incorporating the invention, the dopant concentration in the oxide layer 26 can be kept very low, particularly adjacent the heavily doped p-type epitaxial layer 24. As set forth earlier, if the oxide layer 26 had a sufficient carrier concentration, a short circuit could occur between layers 24 and 23, thus incapacitating the device.

To complete the device, FIG. 4 also illustrates an ohmic contact 27 to the substrate, preferably formed of nickel, and an ohmic contact 28 to the p-type epitaxial layer on the mesa, and preferably formed of an aluminum alloy.

It will be understood to those familiar with such devices that the invention can also be applied to structures in addition to those illustrated herein, including p-channel planar MOSFETs having implanted p-type wells, and those in which the p-type source and drain are formed from epilayers that have been partially etched away. In either case, an oxide typically will border both a p-portion and an n-portion of the device so that any leakage through the oxide portion will essentially short the device, the avoidance of which is one of the main advantages of the present invention.

The invention can also be applied to any vertical power MOSFET design in SiC, such as DDMOS (double diffused MOS), UMOS (U-channel MOS), or VMOS (V-channel MOS), that would require use of aluminum as the channel dopant.

In the drawings and specifications, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A method of obtaining high quality passivation layers on silicon carbide surfaces, the method comprising:

forming a sacrificial layer of silicon carbide on a silicon carbide portion of a device structure, wherein the silicon carbide has a concentration of impurities that can affect the electrical characteristics of the oxidized material of no more than 5E16 ($5 \times 10^{-16}$ cm$^{-3}$); and oxidizing the sacrificial layer on the basis of the thickness of the sacrificial layer and the oxide consumption factor for silicon carbide to substantially consume the sacrificial layer to produce an oxide passivation layer on the silicon carbide portion that is substantially free of dopants and other species that would otherwise degrade the electrical integrity of the oxide layer, and that has a thickness sufficient to have substantially consumed the sacrificial layer based upon the thickness of the sacrificial layer and the oxide consumption factor of silicon carbide.

2. A method according to claim 1 wherein the step of oxidizing the sacrificial layer comprises thermally oxidizing the sacrificial layer.

3. A method according to claim 2 wherein the step of thermally oxidizing the sacrificial layer to substantially consume the sacrificial layer comprises thermally oxidizing the sacrificial layer while avoiding oxidation of the underlying silicon carbide portion.

4. A method according to claim 1 wherein the step of forming a sacrificial layer of silicon carbide on a silicon carbide portion of a device structure comprises forming the sacrificial layer on a silicon carbide portion having a polytype selected from the group consisting of: the 6H, 3C, 4H, 2H, and 15R polytypes of silicon carbide.

5. A method according to claim 1 wherein the consumption factor for silicon carbide is the ratio of the density of silicon atoms in silicon dioxide to the density of silicon atoms in silicon carbide.

6. A method according to claim 1 wherein the step of forming a sacrificial layer of silicon carbide on a silicon carbide portion of a device structure comprises forming the sacrificial layer on a p-type portion of silicon carbide.

7. A method according to claim 6 wherein the step of forming the sacrificial layer on a p-type portion of silicon carbide comprises forming the sacrificial layer on an aluminum-doped p-type portion of silicon carbide.

8. A method of obtaining high quality passivation layers on silicon carbide surfaces, the method comprising:

depositing a thin boron-doped silicon carbide epitaxial layer on a p-type silicon carbide portion of a device structure;

forming a sacrificial layer of silicon on the boron-doped silicon carbide epitaxial layer; and thermally oxidizing the silicon layer while avoiding oxidation of the underlying p-type silicon carbide portion to substantially consume the silicon layer to produce an oxide passivation layer on the silicon carbide portion that is substantially free of dopants and carbon-oxygen by-product species that would otherwise degrade the electrical integrity of the oxide layer;

wherein the boron-doped silicon carbide spitaxial layer is thick enough to prevent aluminum from reaching the resulting oxide while otherwise remaining as thin as possible.

9. A method according to claim 8 wherein the step of depositing a boron-doped silicon carbide epitaxial layer comprises depositing a layer selected from the group consisting of: semi-insulating boron-doped silicon carbide layers and p-type boron-doped silicon carbide layers.

10. A method according to claim 8 wherein the step of thermally oxidizing the silicon layer comprises oxidizing the silicon layer to produce an oxide passivation layer on the silicon carbide portion in which the oxide layer has an aluminum dopant concentration of 3E17 ($3 \times 10^{-17}$ cm$^{-3}$) or less.

* * * * *